United States Patent [19]
Wollesen

[11] Patent Number: 5,828,110
[45] Date of Patent: Oct. 27, 1998

[54] LATCHUP-PROOF I/O CIRCUIT IMPLEMENTATION

[75] Inventor: Donald L. Wollesen, Saratoga, Calif.

[73] Assignee: Advanced Micro Devices, Inc., Sunnyvale, Calif.

[21] Appl. No.: 769,065

[22] Filed: Dec. 18, 1996

Related U.S. Application Data

[63] Continuation of Ser. No. 462,460, Jun. 5, 1995, abandoned.

[51] Int. Cl.[6] .................... H01L 29/772; H01L 27/105
[52] U.S. Cl. .................... 257/373; 257/372; 257/370; 257/547
[58] Field of Search .................... 257/372, 373, 257/375, 376, 547, 370

[56] References Cited

U.S. PATENT DOCUMENTS

| | | | |
|---|---|---|---|
| 3,955,210 | 5/1976 | Bhatia et al. | 257/373 |
| 5,060,044 | 10/1991 | Tomassetti | 257/375 |
| 5,111,274 | 5/1992 | Tomizuka et al. | 257/547 |
| 5,491,358 | 2/1996 | Miyata | 257/372 |

Primary Examiner—Jerome Jackson
Attorney, Agent, or Firm—McDermott, Will & Emery

[57] ABSTRACT

An arrangement that prevents triggering of latchup in internal circuits by input/output buffers on an integrated circuit chip provides a space surrounding each active device connected to a bond pad. A ring well surrounds the space and separates the active device from the internal circuits of the chip. The ring well serves as a collector to prevent triggering latchup by the active device of the internal circuits located outside the ring well.

13 Claims, 7 Drawing Sheets

LATCHUP-PROOF I/O CIRCUIT IMPLEMENTATION

This application is a continuation of application Ser. No. 08/462,460 filed Jun. 5, 1995 abandoned.

BACKGROUND OF THE INVENTION

1. Technical Field of the Invention

The present invention relates to the field of semiconductor circuits, and more particularly, to the design of circuits that have improved latchup performance.

2. Description of Related Art

For integrated circuits that are designed with NPNP or PNPN structures in bulk silicon, such as complementary metal-oxide semiconductor (CMOS), bipolar and BiCMOS technologies, the phenomenon known as "latchup" needs to be taken into consideration by a designer. Latchup is a parasitic conduction mechanism to which CMOS structures have an inherent vulnerability. It is a thyristor operating mechanism that can be triggered in NPNP structures. If any such NPNP structure is triggered into latchup on a chip, large currents can flow and the results are usually irreversibly catostropic for the whole chip.

FIG. 1 depicts a cross-section of a prior art CMOS device. The substrate may be either N-substrate or P-substrate. The N-channel MOS transistor is formed within a P-well, while the P-channel transistor is formed within an N-well. The N-channel MOS transistor has a P+ well tie at its outer area. Similarly, the P-channel MOS transistor has an N+ well tie at its outer area.

The cross-section of the prior art CMOS arrangement of FIG. 1 is represented by an NPN-PNP latchup model schematic as provided in FIG. 2. This arrangement, with its specific locations of the N-well resistance and P-well resistance within the circuit, allows latchup to occur. This information is described in IEEE Latchup Test Standard No. 1181-1991.

A number of different methodologies have been used in attempts to overcome the latchup problem. If non-epitaxial starting material is used, the minority carrier range can be in the hundreds to thousands of microns, much greater than the N+ to P+ spacing which is commonly less than 20 microns for input/output (I/O) layouts. On lightly doped non-epi bulk material, this "vertical" component dominates silicon control rectifier (SCR) latchup and renders ineffective guard rings, guard bars and topological layout methodologies that attempt to reduce latchup. Although these different methodologies work to some extent, they are not completely effective so that the most common previous solution was to set the "N+ to P+ spacing" to a larger value. For a typical bonding pad pitch of 200 microns, this setting of the N+ to P+ spacing to a larger value is not limiting. However, when the bonding pad pitch is less than 100 microns or in area array bonding, then relatively large (greater than 10 microns) N+ to P+ spacings will be a significant layout area constraint on the chip size and bond pad pitch.

For the vertical NPN or PNP component, a number of solutions have been tried, but each of these add to the cost of the wafer. These include epitaxial (epi); buried layer (under the well); retrograde wells; and "silicon-on insulator" (SOI) technologies. As the SOI technologies do not latchup, they will not be discussed further. However, in addition to their increased cost, the SOI technologies have other problems.

The epi, buried layer, and retrograde wells attempted solutions successfully deal with the vertical component diffusion distance issue so that guard rings are always effective. Hence, an output buffer in CMOS will not latchup. However, when latchup is observed in contemporary CMOS on epi, it is not the output buffer that is latched up, but rather the latchup is triggered somewhere else on the chip by the input, output or input/output devices. FIG. 5 illustrates the latchup of circuits that are not connected to the bond pad (i.e. remote circuitry points internal to the chip). This latchup is caused by the latchup-proof I/O circuits that trigger the latchup at the remote circuitry points, such as points A, B and C. Bonding pads are stimulated by a fault condition of overshoot or undershoot to cause the latchup condition in the remote circuitry points.

FIG. 6 provides a cross-section of the prior art arrangement of FIG. 5. In this case, the technology is P-well on N-epi on N+ substrate, but the technology can be with or without epi and can be N-well or P-well. In FIG. 6, the PMOS device and the N-MOS device on the left-hand side (bracket D) of FIG. 6 trigger the latchup that occurs in the internal gates on the right-hand side (bracket E) of FIG. 6. Thus, even with latchup proof input, output or I/O devices connected to bonding pads, latchup triggered by these devices in internal gates may still occur.

SUMMARY OF THE INVENTION

There is a need for a design that prevents latchup in internal circuitry that is remote from the bonding pads from being triggered by devices that are connected to the bonding pads. Such a design needs to be implementable without significantly increasing the cost of the wafer.

This and other needs are met by the present invention which provides a latchup reducing input/output (I/O) arrangement for an integrated circuit chip having a plurality of devices. The arrangement comprises an active device connected to a bond pad, a space surrounding the output device, and a ring well surrounding the space and separating the active device from the other ones of the plurality of devices. The ring well serves as a collector to prevent active device triggering of latchup of the devices from one side of the ring well to devices on the other side.

The ring well that serves as a collector and separates the active device from the other devices, may be readily implemented by forming a P-well (when the substrate is an N-substrate) with a P+ region to which the voltage supply VSS makes ohmic contact.

The present invention finds particular utility when used in an area array bond pad layout in which the bond pads are located in an array over the entire surface of the chip, instead of just around the periphery of the chip. To accomplish this arrangement, a plurality of bond pads are distributed in an array over the chip and a plurality of active devices are connected to the bond pads, with each of these active devices being at least one of an input circuit and an output circuit. A plurality of spaces are provided, with each space surrounding a different one of the active devices. A plurality of ring wells are provided, with each ring well surrounding a different one of the spaces and separating the active device within each space from the other ones of the plurality of devices on the chip. These ring wells serve as individual collectors to prevent triggering by the active devices of latchup of the devices located outside the ring wells.

The earlier stated needs are also met by another embodiment of the present invention which provides an integrated circuit chip with reduced latchup of internal circuitry. The integrated circuit chip comprises a plurality of bond pads mounted around an outer periphery of the chip, and a ring well on the chip with an area bounded by the bond pads. Internal circuitry is located within an area of the chip bounded by the ring well. Active input/output devices are connected to the bond pads and are located outside of the area bounded by the ring well. Internal circuitry is protected by the ring well from latchup triggered by the active input/output devices.

This embodiment of the present invention protects internal circuitry from latchup triggered by the input, output and I/O circuits in a chip designed with bond pads located around the periphery of the chip as in more traditional chip designs.

Another aspect of the present invention improves the latchup performance of a CMOS (complementary metal-oxide semiconductor) arrangement. The CMOS of the present invention has a substrate, an N-channel MOS (NMOS) transistor in a P-well in the substrate, with a P+ area and a well tie connected to the P+ area located at an inner area of the NMOS transistor. N+ areas are located at an outer area of the NMOS transistor. A P-channel MOS (PMOS) transistor is provided in an N-well in the substrate, with an N+ area and a well tie connected to the N+ area located at an inner area of the PMOS transistor. The P+ areas of the PMOS transistor are located at an outer area of the PMOS transistor. The inner areas of the NMOS transistor and the PMOS transistor are substantially adjacent to one another.

The arrangement of the well ties and the P+ area of the NMOS transistor and the N+ area of the PMOS transistor at the inner areas of the transistors so that they are substantially adjacent to one another prevents latchup in the CMOS arrangement. This layout results in moving the well resistor from the base-to-ground (FIG. 2), as in the prior art, to the emitter-to-ground (FIG. 4).

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 3:
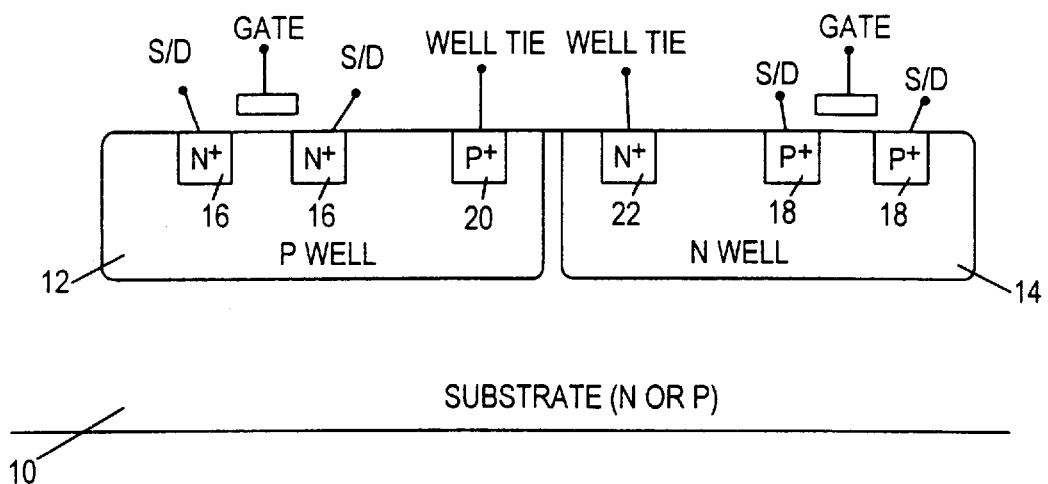
FIG. 3 is a cross-section of a CMOS device constructed in accordance with an embodiment of the present invention.

The CMOS arrangement of FIG. 3, in accordance with the invention, comprises a substrate 10 that is either an N-type substrate or a P-type substrate. (For purposes of simplicity, the term "-type" will be omitted from the following description.) In the substrate 10, a P-well 12 and an N-well 14 are provided. In the P-well 12 are two N+ portions 16, that, together with the gate, form an N-channel transistor. Similarly, in the N-well 14, two P+ portions 18, along with the gate, form a P-channel transistor. The P-well also contains a P+ region that is a well tie connected to a voltage supply (VSS) (not shown). The P+ section 20 is located at an inner area of the P-well. This inner area is substantially adjacent the inner area of the N-well 14. An N+ section 22 of the N-well 14 is located at the inner area of the N-well 14.

Figure 1:
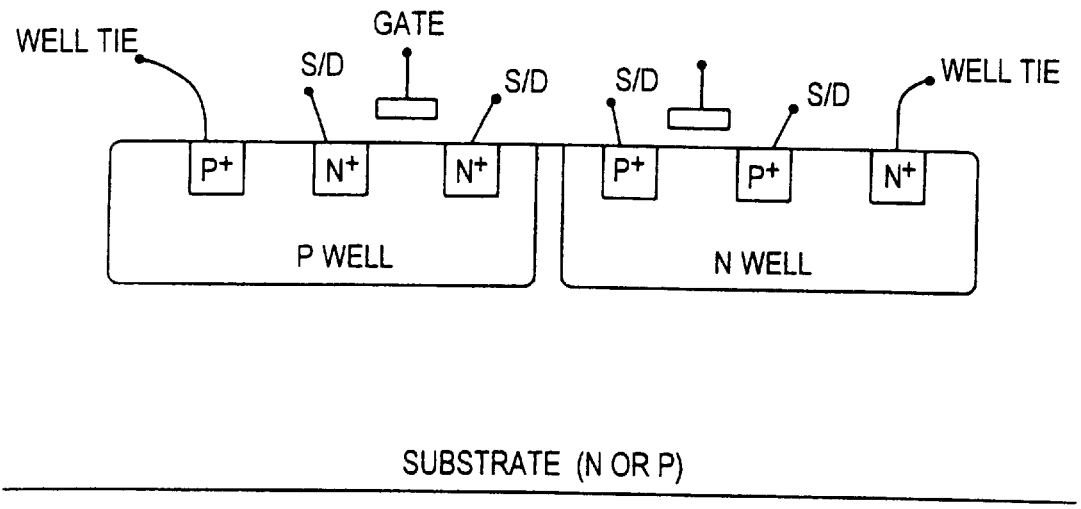
FIG. 1 is a cross-section of a prior art CMOS arrangement.
Figure 2:
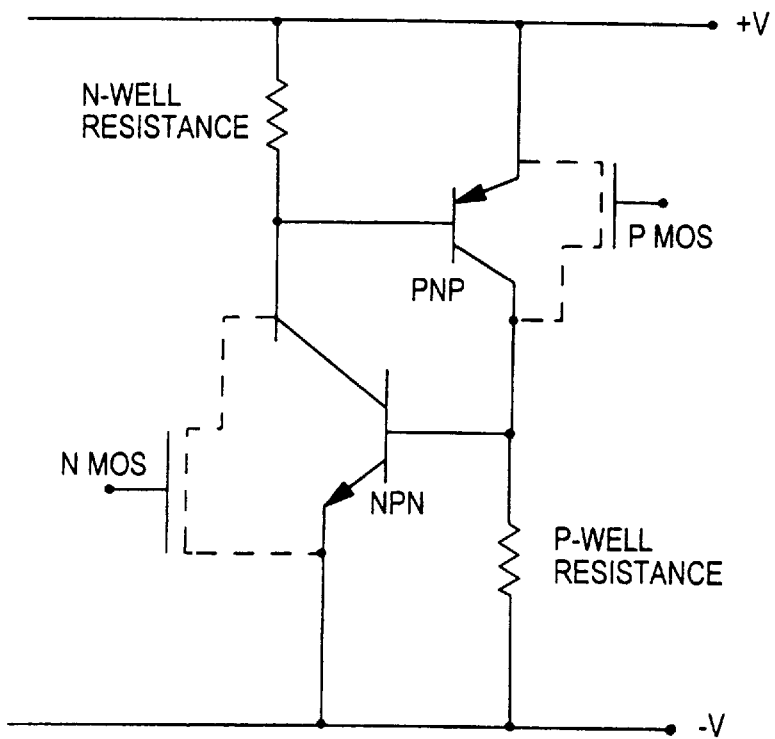
FIG. 2 is a schematic diagram depicting a model of the NPN-PNP latchup of the CMOS device of FIG. 1.
Figure 4:
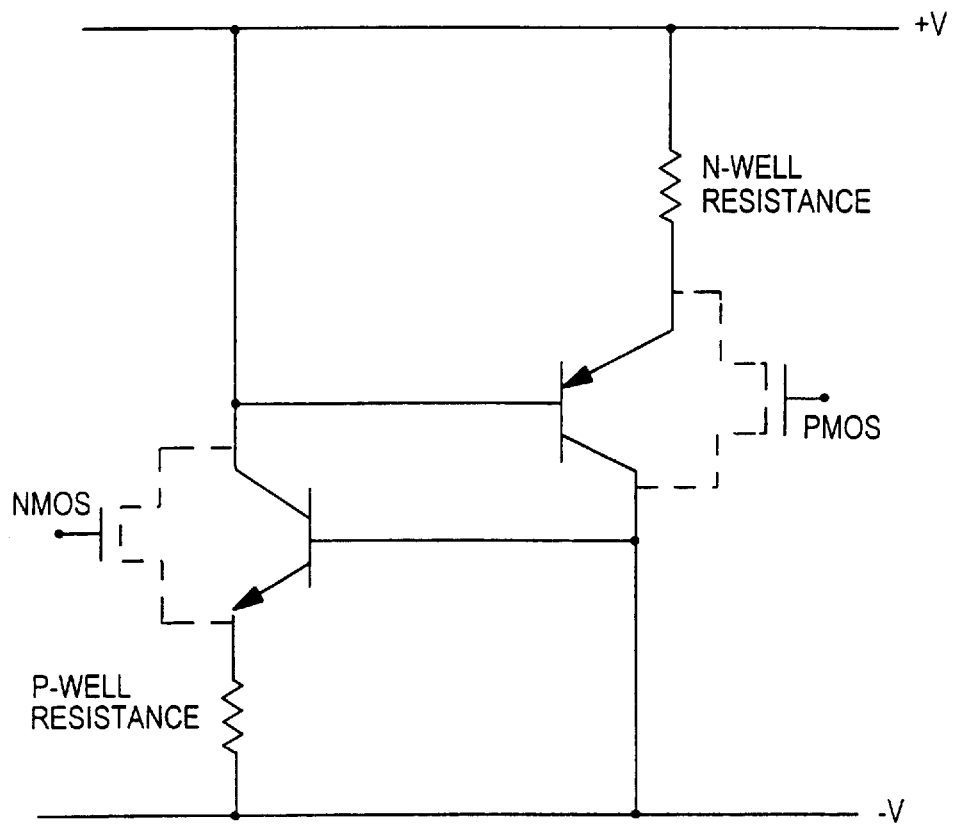
FIG. 4 is a schematic diagram representing the CMOS arrangement of FIG. 3.
Figure 5:
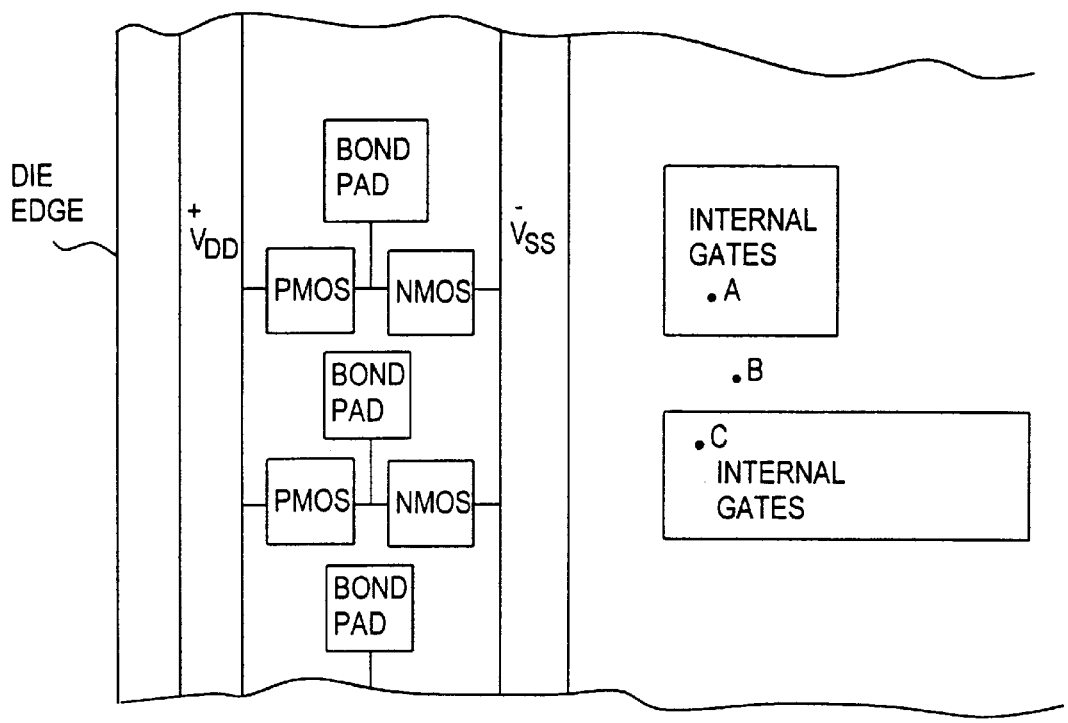
FIG. 5 is a block diagram of a prior art arrangement of a portion of an integrated circuit chip in which latchup occurs in circuits that are not connected to bond pads.
Figure 6:
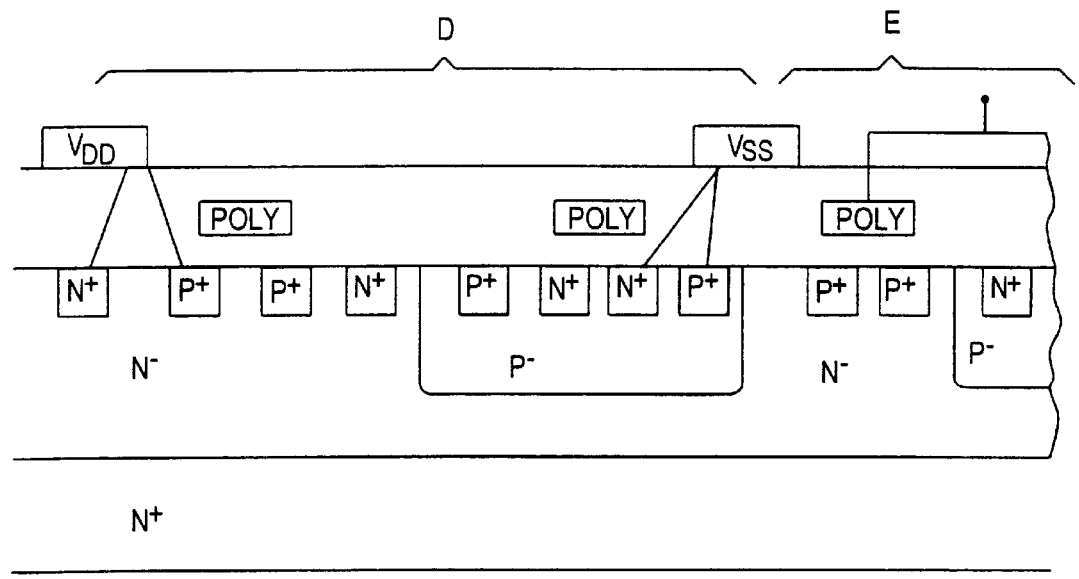
FIG. 6 is a cross-section of the circuitry depicted in FIG. 5.

The embodiment of the present invention provided in FIG. 3 leads to the schematic diagram of FIG. 4. A comparison of the diagrams of FIGS. 3 and 4 with the prior art arrangement of FIGS. 1 and 2 reveals that the present invention provides the well ties on an inner area of the respective P and N wells, while the prior art well ties are provided on the outer areas of the P and N wells. In the prior art, the P-well resistance and the N-well resistance are connected from the base to the ground, while the arrangement of the present invention provides the N-well resistance and the P-well resistance from the emitter-to-ground, as apparent in FIG. 4.

Figure 8:
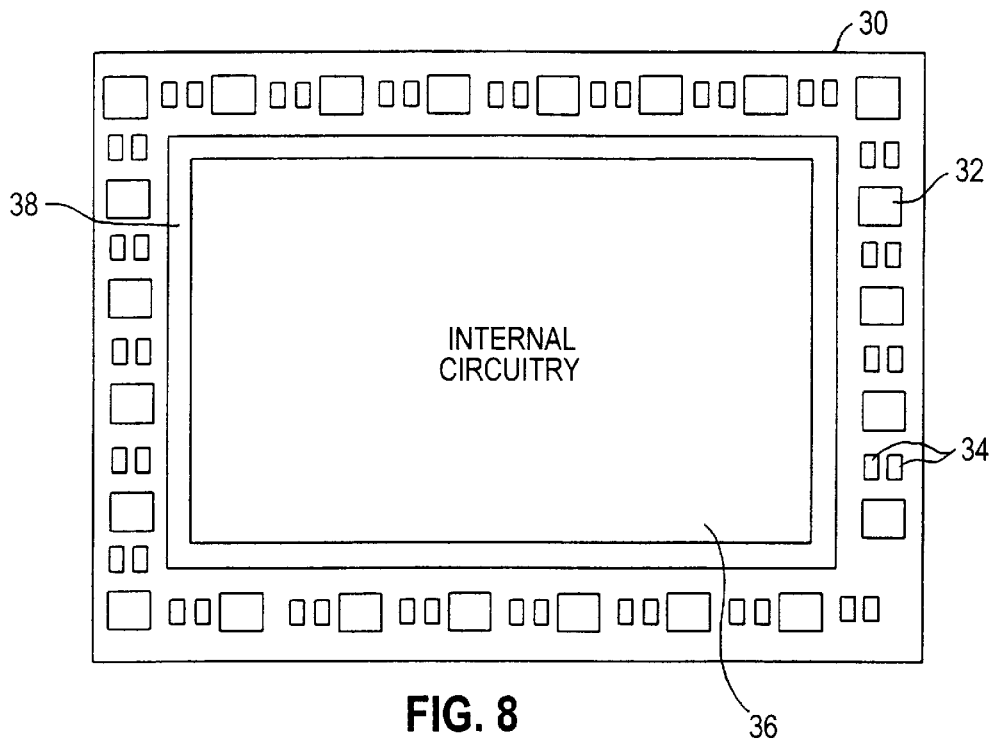
FIG. 8 is a top view of the integrated circuit chip shown in FIG. 7.

In another embodiment of the present invention, all of the internal circuitry of an integrated circuit chip is protected from latchup triggered by the input, output or I/O devices that are connected to the bond pads on the periphery of the integrated circuit chip. FIG. 8 is a top view of an integrated circuit chip 30 that is provided with this protection. The integrated circuit chip 30 has a plurality of bond pads 32 at which input signals to the chip 30 or output signals from the chip 30 are provided. Inputs, outputs or I/O cells 34 are connected with the individual bond pads 32. The internal circuitry of the chip 36 is protected from latchups caused by the inputs, outputs or I/O cells 34 by a ring well 38 that is located within the area bounded by the bond pads 32. The internal circuitry 36 is located within the area of the chip 30 that is bounded by the ring well 38.

Figure 7:
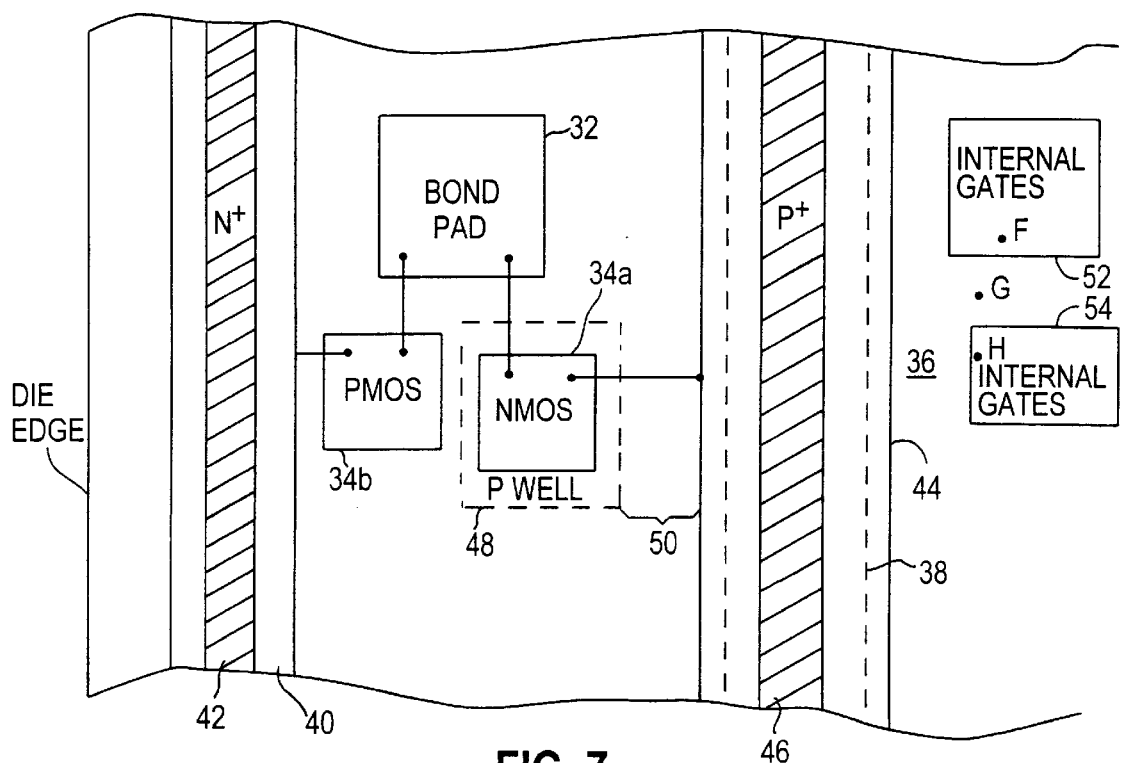
FIG. 7 is a diagram of a portion of an integrated circuit chip constructed in accordance with the present invention in which the internal circuits are protected from the latchup caused by I/O triggering.

FIG. 7 is a top view of a portion of the integrated circuit chip 30 of FIG. 8. In the exemplary embodiment of FIG. 7, the substrate is an N-substrate so that the ring well is a P-well. When the substrate is a P-substrate, the ring well will be an N-well. The bond pad 32 receives input signals to the integrated circuit chip 30 or provides output signals from the integrated circuit chip 30. An NMOS circuit 34a and a PMOS circuit 34b could be either input, output or I/O cells and are connected with the bond pad 32. The NMOS circuit 34a is also connected to the VSS metal 44 that carries the voltage supply. Similarly the PMOS circuit 34b, in addition to being coupled to the bond pad 32, is also coupled to the VDD metal 40. The VSS metal 44 contacts the ring well 38 that is formed in this case by a P-well (since the substrate is an N-substrate). Within the P-well of the ring well 38, a P+ region 46 is located. This P+ region 46 provides good ohmic contact to the VSS metal 44.

The NMOS circuit 34a is located within a P-well 48. An N-space 50 is provided in the substrate between the P-well 48 that surrounds the NMOS circuit 34a and the P-well 38 of the ring well.

The VDD metal 40 is connected to an N+ region of the N-substrate known to make proper ohmic contact.

Without the ring well 38, the internal circuitry, which includes internal gates 52 and 54, will be subject to possible latchup from I/O triggering by the NMOS circuit 34A and the PMOS circuit 34B at points F, G and H. However, due to the ring well 38 of the present invention, which acts as a collector, the internal circuitry 36, including the internal gates 52, 54 is protected from latchup caused by the I/O circuitry.

The layout of FIG. 8 detailed in FIG. 7 protects the internal circuitry 36 from external triggering. The present invention allows the internal circuitry to be protected to be included in an input or output buffer. In order to do so, the ring well collector 38 is separated from the active device well, in the case the P-well 48. In the embodiment of FIG. 7, this separation is formed by the N-space 50 located between the active device well 48 and the ring well 38. The N-space 50 (or P-space for N-well CMOS) is necessary because minority carriers in this region are collected by the ring well 38, thereby becoming majority carriers in the process and no longer a concern for latchup. Likewise, any minority carriers in the active P-well 48 become majority carriers in the N-space 50 and are no longer a latchup concern.

Although FIGS. 7 and 8 depict the VSS metal 44 inside the bond pads 32, in other embodiments, the VSS metal 44 and the VDD metal 40 are routed at will. However, the ring P-well 38 should be connected to the VSS metal 44 very often in order to provide proper latchup protection.

As apparent to one of ordinary skill in the art, if N-well on P-epi and P+ substrate is used in other embodiments, then the ring well 38 will be an N-well connected to the VDD metal 40. Also, although the VSS metal 44 is illustrated as continuous, it is possible for several different VSS metals to be used and commonly tied to the P-well ring 38 or not. If they are not commonly tied to the P-well ring 38, the well resistance (typically greater than 1K ohm/square-cm) will provide a resistive connection to separate multiple VSS metal lines.

Figure 9:
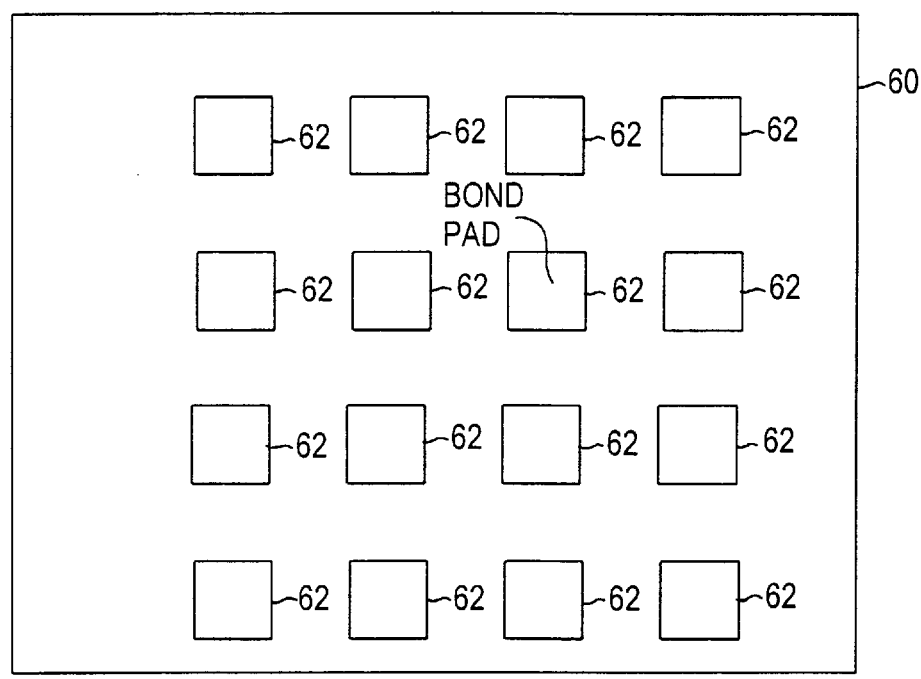
FIG. 9 is a block diagram depicting an exemplary area array bond pad layout.
Figure 10A:
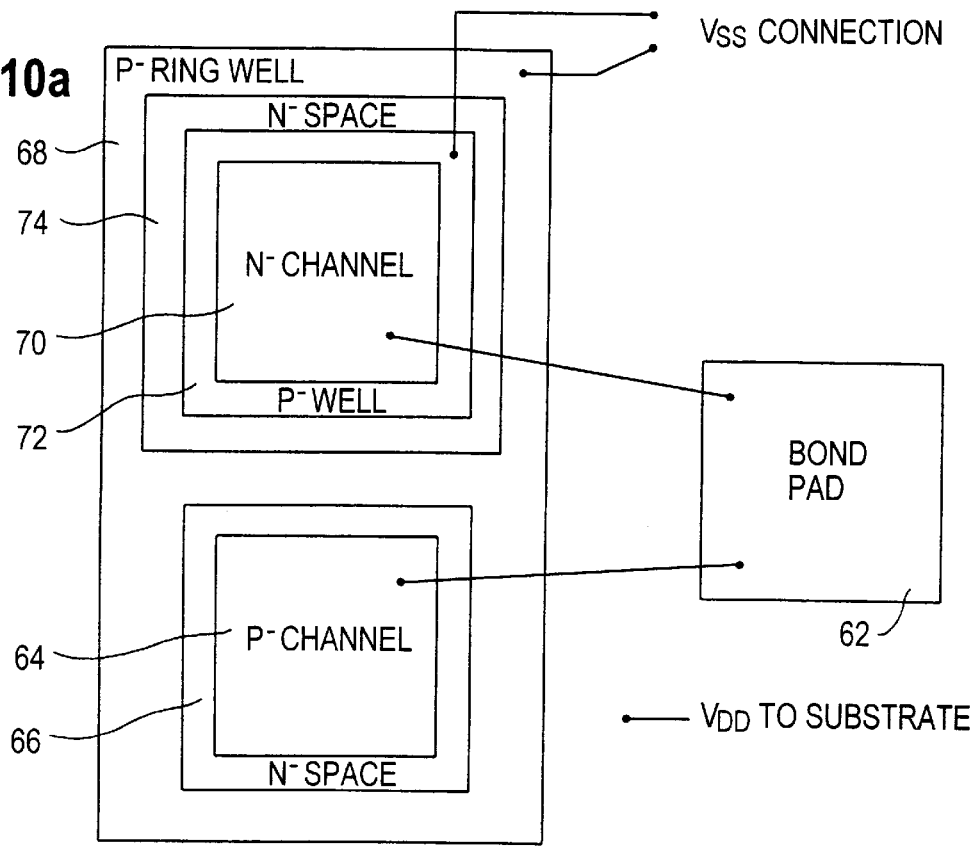
FIG. 10a is a top view of an embodiment of the present invention used in the area array bonding layout of FIG. 9, having an N-substrate and a P-well.

An area of relatively recent development is area array bond pad layouts, such as that illustrated in FIG. 9, in which the bond pads 62 are distributed in an array over the integrated circuit chip 60. Associated with the bond pads 62 are individual input/output (I/O) buffers. As with integrated circuit chips in which the bond pads are distributed around the periphery of the chip, such as shown in FIG. 8, the other circuits on the chip 60 need to be protected from latchup triggered by the I/O buffers connected to the individual bond pads 62. FIG. 10a illustrates one embodiment of the present invention for use on an area array bond pad layout integrated circuit chip 60. In this embodiment, the substrate is an N-substrate.

In order to protect other devices from latchup triggered by an I/O buffer, the active devices which are not in a well (i.e. they are formed in the bulk doped material) need to be surrounded with a substrate space. In FIG. 10a, for example, the P-channel transistor 64, which is not formed in a well, is surrounded by the N-space 66 and by the P-ring well 68.

For those active devices that are formed within an active device well, a space and a ring well are required. This is exemplified by the N-channel transistor 70, connected to the bond pad 62, that is located within an active device P-well 72. An N-space 74 surrounds the active device P-well 72. The N-space 74 is itself surrounded by the P-ring well 68. The P-ring well and the active device P-well are both connected to the VSS metal. The substrate is connected to VDD in this example.

With the embodiment of the present invention illustrated in FIG. 10a, the active device connected to the bond pad may be located anywhere on the integrated circuit chip 60 without triggering latchup in any of the other devices located on the integrated circuit chip 60.

Figure 10B:
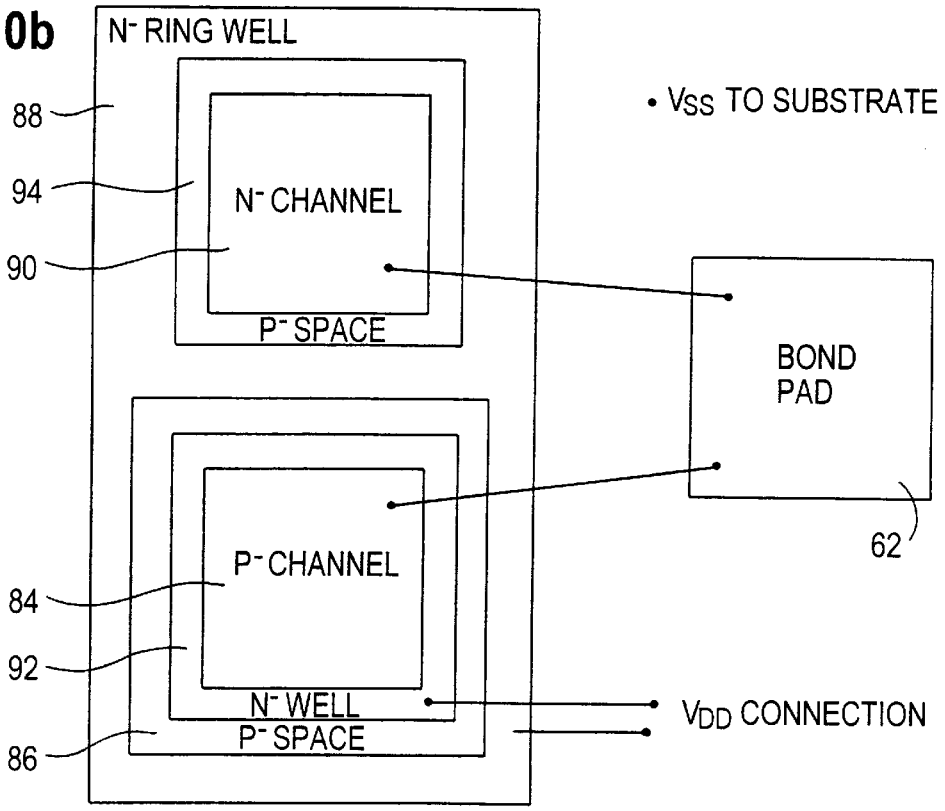
FIG. 10b is a block diagram of an embodiment of the present invention used in the area array bonding layout of FIG. 9, having a P-substrate and an N-well.

FIG. 10b is similar to FIG. 10a, but depicts an application in which the substrate is a P-substrate. Accordingly, the N-channel transistor 90 is surrounded by P-space 94 and the N- ring well 88. The P-channel transistor 84, in turn, is provided in an active device N-well 92 that is surrounded by a P-space 86 in which is surrounded by the N-ring well 88. The N-ring well 88 and the active device N-well 92 are both connected to the VDD metal, while the VSS is connected to the P-substrate in this embodiment.

In addition to the use of the embodiments of FIGS. 10a and 10b in an area array bond pad layout, the surrounding of the individual transistors as in FIGS. 10a and 10b may also be used when the bond pads are laid out around the periphery of the integrated circuit chip, as depicted in FIG. 8.

Figure 11:
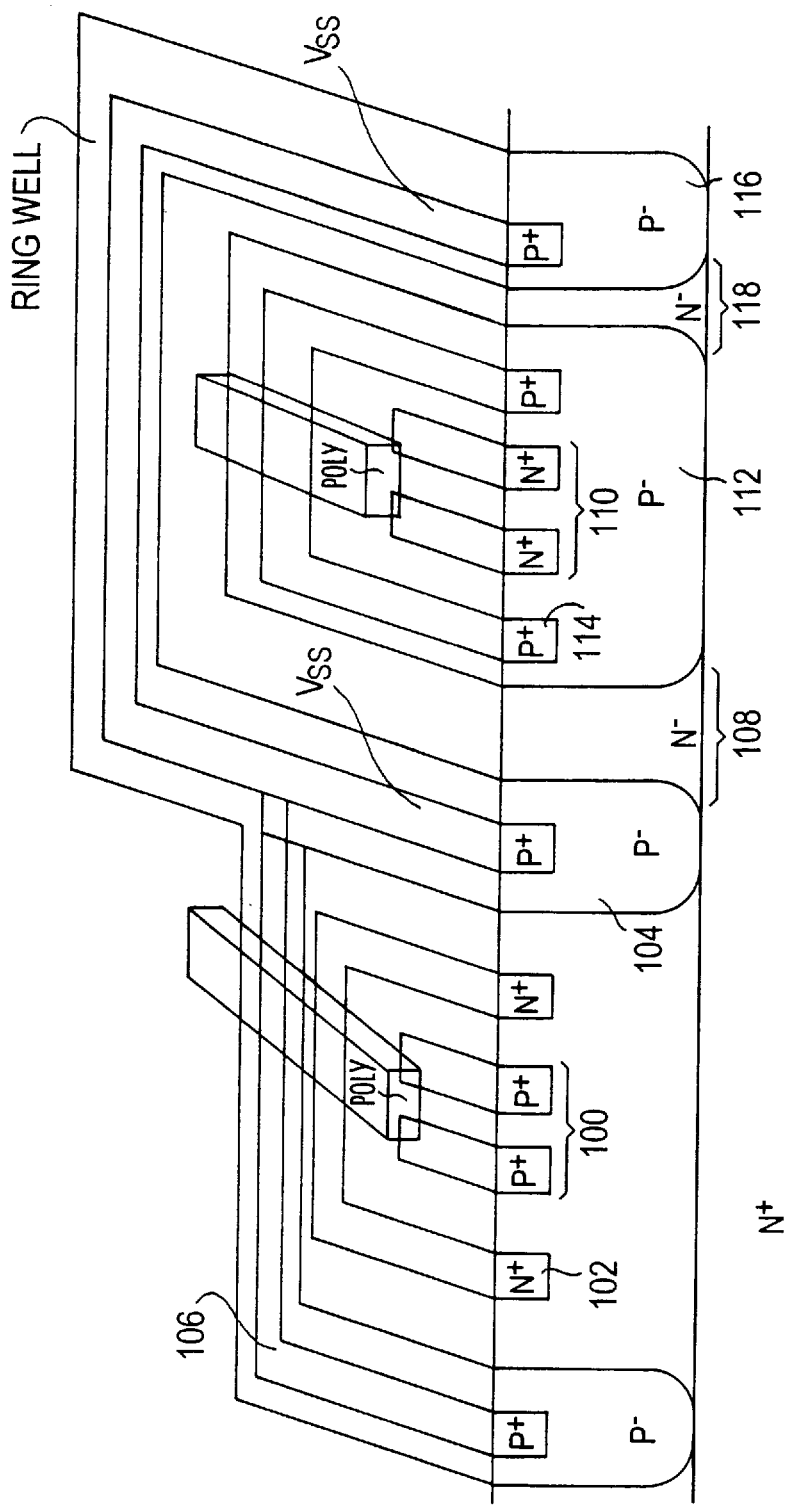
FIG. 11 is a cross-section of an embodiment of the present invention having a modified ring well (N substrate and P-well illustrated).

FIG. 11 is a cross-section of a ring well in accordance with an embodiment of the present invention. The P-channel device 100 is provided with a guard ring 102 as is well known. In order to prevent latchup, however, a P-ring well 104 is provided. This P-ring well 104 also has a P+ section 106 that provides ohmic contact to the VSS metal. An N-space 108 separates the ring well 104 from an N-channel device 110 formed in the P-well 112. The N-channel device 110 also has a guard ring 114. The input/output buffer formed by the P-channel device 100 and the N-channel device 110 is prevented from triggering latchup in internal circuit devices by an additional P-ring collector well 116. A second N-space 118 separates the N-channel device 110 from the ring well collector 116. This double protection provided by the two ring wells 104 and 116, as well as the N-spaces 108 and 118, serve to doubly protect internal devices on the integrated circuit chip from latchup.

The present invention as described above provides a relatively inexpensive and effective means of protecting internal devices from latchup caused by the input, output and I/O cells connected to the bond pads in the integrated circuit chip, whether these bond pads are distributed around only the periphery of the integrated circuit chip or all over the chip.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A latchup reducing input/output (I/O) arrangement for an integrated circuit chip having a plurality of devices including an active device on a common substrate, the arrangement comprising:

an active device on the substrate and connected to a bond pad, the active device residing in a region of a first conductivity type;

a space region of a second conductivity type opposite to the first conductivity type on the substrate, the space region surrounding the active device; and a ring well on the substrate, the ring well of the first conductivity type, the ring well surrounding and electrically isolated from the region in which the active device resides by the space region and separating the active device from each of the other ones of the plurality of devices and acting as a collector to prevent active device triggering of latchup of the devices outside the ring well.

2. The arrangement of claim 1, further comprising an active device well surrounding the active device and surrounded by, and spaced apart from the ring well.

3. The arrangement of claim 2, wherein the active device is an N channel device, the active device well is a P-well, a region between the active device well and the ring well is an N-region, and the ring well is a P-ring well.

4. The arrangement of claim 2, wherein the active device is a P channel device, the active device well is an N-well, a region between the active device well and the ring well is a P-region, and the ring well is an N-ring well.

5. The arrangement of claim 1, wherein the active device is an N channel device, a region between the active device and the ring well is an N-region, and the ring well is a P-ring well.

6. The arrangement of claim 1, wherein the active device is a P channel device, a region between the active device and the ring well is a P-region, and the ring well is an N-ring well.

7. The arrangement of claim 1, further comprising:

a plurality of bond pads distributed in an array over the chip; a plurality of said active devices connected to said bond pads, wherein each of said active devices is at least one of an input circuit and an output circuit; a plurality of said space regions, each said space region surrounding a different one of said active devices; and a plurality of said ring wells, each said ring well surrounding a different one of the regions and separating the active device within each space region from the other ones of the plurality of devices on the chip, the ring wells serving as collectors to thereby prevent triggering by the active devices of latchup of the devices outside the ring wells.

8. A latchup reducing input/output (I/O) arrangement for an integrated circuit chip having a plurality of bond pads distributed in an array over the chip, the arrangement comprising:

a common substrate;

a first set of devices on the common substrate;

a second set of devices on the common substrate, each one of the devices of the second set being an active device in a first region having a conductivity type and connected to one of the bond pads, wherein each of the active devices is at least one of an input circuit and an output circuit;

a plurality of space regions, each one of the space regions surrounding at least one of the devices of the second set of devices, each one of the space regions having a conductivity type opposite to the conductivity type of the first region; and a plurality of ring wells on the substrate, each ring well surrounding at least one space region and spaced apart from the active devices, the ring wells separating each of the active devices from each other and from the first set of devices, each ring well serving as a collector preventing active device triggering of latchup of the first set of devices outside the ring wells.

9. The arrangement of claim 1, wherein the ring well includes a low impurity region and a high impurity region, the high impurity region formed in the low impurity region and having ohmic contact with a metal layer coupled to a voltage source, the low and high impurity regions each extending in parallel along a length of the ring well.

10. The arrangement of claim 8, wherein each ring well includes a low impurity region and a high impurity region, the high impurity region formed in the low impurity region and having ohmic contact with a metal layer coupled to a voltage source, the low and high impurity regions each extending in parallel along a length of the ring well.

11. A latchup reducing input/output (I/O) arrangement for an integrated circuit chip, comprising:

a plurality of bond pads on the integrated circuit chip;

a first active device having a first conductivity-type channel and connected to one of the bond pads;

a second active device having a second conductivity-type channel opposite to the first conductivity-type channel and connected to the one bond pad;

a plurality of devices on a substrate of the integrated circuit chip;

a ring well on the substrate and having a first conductivity type, the ring well including a low impurity region of the first conductivity type and a high impurity region of the first conductivity type, the high impurity region formed in the low impurity region and having ohmic contact with a metal layer coupled to a voltage source, the ring well electrically separating the first and second active devices from each other and from the plurality of devices on the integrated circuit chip substrate;

a first space region surrounding the first active device and having a second conductivity type opposite the first conductivity type, the first space region electrically isolating the ring well from the first active device; and a second space region surrounding the second active device and having the second conductivity type, the second space region electrically isolating the ring well from the second active device, the ring well preventing the first and second active devices from triggering any latchup condition.

12. The arrangement of claim 11, wherein the ring well collects minority carriers in the first and second space region, the minority carries becoming majority carriers within the ring well.

13. The arrangement of claim 11, wherein the low impurity region is a P-doped region and the high impurity region is a P+ doped region, the first and second space regions each having N-type conductivity.

* * * * *